United States Patent
Oka

(10) Patent No.: US 6,174,751 B1
(45) Date of Patent: Jan. 16, 2001

(54) METHOD OF MANUFACTURING RESIN ENCAPSULATED SEMICONDUCTOR DEVICE

(75) Inventor: Takahiro Oka, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/484,900

(22) Filed: Jan. 18, 2000

(30) Foreign Application Priority Data

Jan. 20, 1999 (JP) .................................................. 11-012239

(51) Int. Cl.[7] .................................................... H01L 21/44
(52) U.S. Cl. ............................ 438/113; 438/108; 438/460
(58) Field of Search .................................... 438/113, 114, 438/108, 460, 461, 462, 463, 464, 465

(56) References Cited

U.S. PATENT DOCUMENTS

| | | | |
|---|---|---|---|
| 5,547,906 | * 8/1996 | Badehi | 438/460 |
| 5,776,798 | * 7/1998 | Quan et al. | 438/112 |
| 5,824,177 | * 10/1998 | Yoshihara et al. | 438/464 |
| 5,948,233 | * 9/1999 | De Samber et al. | 438/113 |
| 5,950,070 | * 9/1999 | Razon et al. | 438/113 |
| 5,989,982 | * 11/1999 | Yoshikazu | 438/462 |
| 6,004,833 | * 12/1999 | Kovats et al. | 438/460 |

* cited by examiner

*Primary Examiner*—Kevin M. Picardat
(74) *Attorney, Agent, or Firm*—Rabin & Champagne, P.C.

(57) ABSTRACT

A method of manufacturing a semiconductor device comprises the steps of providing a semiconductor wafer including semiconductor chip regions each of which has a protruding electrode formed on a main surface of the semiconductor wafer and scribe lines surrounding the semiconductor chip regions and providing a substrate including main body portions each of which corresponds to one of the semiconductor chip regions and cut lines each of which corresponds to one of the scribe lines, each of the main body portions having an inner pad formed on a chip mounting surface of the substrate and a connecting pad formed on a back surface of the substrate, the inner pad corresponding to the protruding electrode, each of the cut lines has a resin injecting hole extending from the chip mounting surface to the back surface. The method further comprises the steps of mounting the chip mounting surface of the substrate on the main surface of the semiconductor wafer so that the protruding electrodes are connected to the inner pads, respectively, injecting a resin to a space between the chip mounting surface and the main surface through resin injecting holes, curing the injected resin, and cutting the substrate, the cured resin and the semiconductor wafer along the cut lines so that semiconductor devices each of which includes the semiconductor chip region of the semiconductor wafer, the cured resin and the main body portion of the substrate are provided.

22 Claims, 6 Drawing Sheets

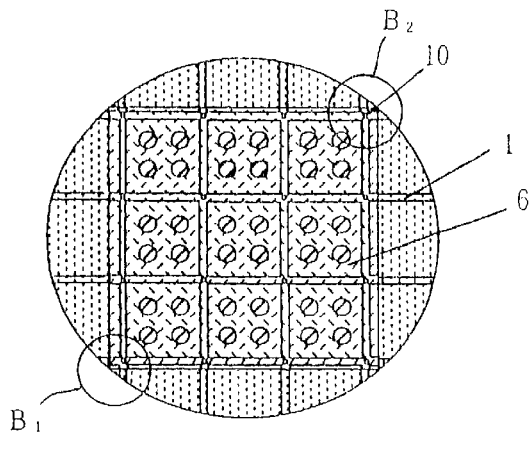
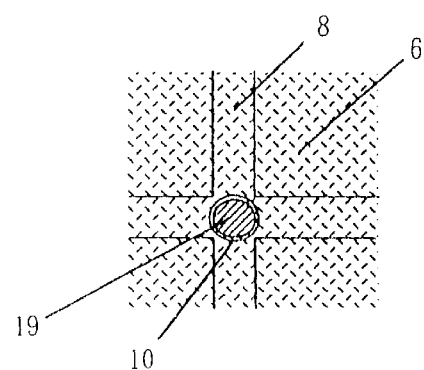
Fig. 10 (a)    Fig. 10 (b)
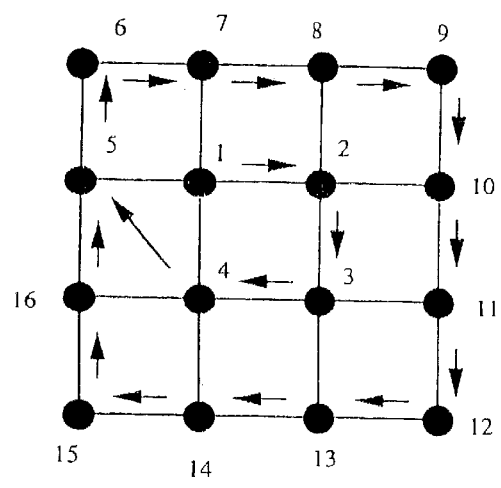
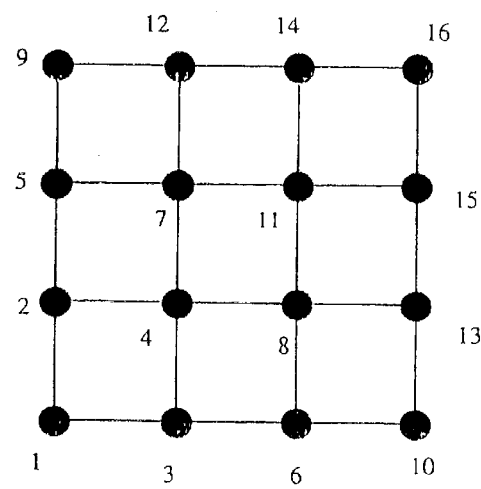
Fig. 11    Fig. 12

METHOD OF MANUFACTURING RESIN ENCAPSULATED SEMICONDUCTOR DEVICE

BACKGROUND OF THE INVENTION

The present invention relates to a method of manufacturing a resin encapsulated semiconductor device.

Of resin encapsulated semiconductor devices which are now in widespread use, a package form called "LGA" (Land Grid Array) is known.

In this type of LGA package, bumps or protruding electrodes are respectively provided over electrode pads which exit on a semiconductor element or chip. Inner pads are provided over a substrate (body portion) comprised of an insulated board such as a printed wiring board made up of a copper-clad laminate or the like, and the protruding electrodes are connected to their corresponding inner pads.

As methods of forming such protruding electrodes, there have been widely adopted a method of effecting plating processing using gold, solder or the like in a final stage of a wafer process generally called "bump", a method of forming balls according to an ultrasonic-combined thermo-compression system or the like, etc.

Further, a metal bonding method using high-temperature processing or a resin-based bonding method, etc. have been widely used for connecting the bumps formed in this way and the inner pads on the substrate respectively. However, there is known a case in which since portions at which the semiconductor chip, substrate and bumps are bonded to one another, are different in thermal expansion coefficient from one anther in a state in which the above way is kept intact, a bonding property might be degraded due to a thermal cycle at an operating environment.

As countermeasures against such a case, a method of charging a resin such as a liquid thermosetting epoxy resin between the semiconductor chip and the substrate has been widely used to improve product quality such as a bonding property, moisture resistance, etc.

Connecting pads printed on the back of the substrate in advance are provided as external connecting terminals [When solder balls are further connected to the connecting pads respectively, a package form called "BGA" (Ball Grid Array) is obtained, which is now widely adopted].

It is also needless to say that the inner pads and connecting pads are electrically connected to one another within the substrate by wires or interconnections and through holes or the like.

As has already been known to date, a size reduction in electronic equipment has been advanced in recent years. Therefore, there is a strong demand for a possible reduction in the outside size of a package mounted on a semiconductor chip. The present package might be generically called "CSP" [Chip Size (or Scale) Package].

It becomes also necessary to reduce the distance between an end surface of the substrate and an end surface of the semiconductor chip or make them flush with each other.

As its corresponding countermeasures, a plurality of bumps or protruding electrodes provided on individually-divided semiconductor chips are normally respectively bonded to inner pads on substrates provided in frame form singly or plurally by the aforementioned method, and a resin is charged between the substrate and each semiconductor chip.

As a method of charging the resin therebetween, a method of dropping a resin by a dispense system and filling with it by a widely known capillary phenomenon has been adopted. Described specifically, when a resin to be charged is dropped onto a substrate by a dispenser, the resin is charged into a clearance between the substrate and a semiconductor chip by the capillary phenomenon, thus leading to completion of a package form.

However, the above-described conventional method involves the following problems upon a reduction in package.

In the dispense system described above, the substrate is mostly set larger than the semiconductor chip in size by about 0.1 mm to 0.3 mm in order to improve workability thereof at the filling of the resin. As a result, the substrate is not completely coincident in size with the semiconductor chip, thus making it impossible to fully meet a demand for a size reduction in most cases. Further, processing such as cutting might be adopted after the filling of the resin to make the substrate and the semiconductor chip coincident in size with each other. However, this has led to a factor in cost-up.

SUMMARY OF THE INVENTION

An object of the present invention is to provide a method of manufacturing a resin encapsulated semiconductor device, which is capable of solving the above-described problems, and assembling a substrate having a plurality of body portions and a wafer formed with semiconductor chips identical in number to one another at a time to thereby facilitate mass production thereof and achieve a reduction in cost and size.

According to an aspect of the present invention, for achieving the above object, there is provided a method of manufacturing a semiconductor device comprising the steps of providing a semiconductor wafer having a main surface, the semiconductor wafer including semiconductor chip regions each of which has a protruding electrode formed on the main surface of the semiconductor wafer and scribe lines surrounding the semiconductor chip regions, providing a substrate having a chip mounting surface and a back surface, the substrate including main body portions each of which corresponds to one of the semiconductor chip regions and cut lines each of which corresponds to one of the scribe lines, each of the main body portions having an inner pad formed on the chip mounting surface and a connecting pad formed on the back surface, the inner pad corresponding to the protruding electrode, each of the cut lines has a resin injecting hole extending from the chip mounting surface to the back surface, mounting the chip mounting surface of the substrate on the main surface of the semiconductor wafer so that the protruding electrodes are connected to the inner pads, respectively, and a space between the chip mounting surface of the substrate and the main surface of the semiconductor wafer is created, injecting a resin to the space between the chip mounting surface and the main surface through resin injecting holes, curing the injected resin, and cutting the substrate, the cured resin and the semiconductor wafer along the cut lines so that semiconductor devices each of which includes the semiconductor chip region of the semiconductor wafer, the cured resin and the main body portion of the substrate are provided.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 3(a)–3(e) are a cross-sectional view illustrating a process for mounting a wafer illustrative of the first embodiment of the present invention on the substrate;

FIGS. 10(a) and 10(b) are views for describing the alignment of the wafer showing the fourth embodiment of the present invention with a substrate;

FIG. 11 is a view illustrating one example of the sequence of the dispensing of a resin from resin injecting holes, according to a fifth embodiment of the present invention; and FIG. 12 is a view depicting one example of the sequence of dispensing of a resin from resin injecting holes, according to a sixth embodiment of the present invention.

DETAILED DESCRIPTION OF THE PREFERRED EMBODIMENTS

Preferred embodiments of the present invention will hereinafter be described with reference to the accompanying drawings.

Figure 1:
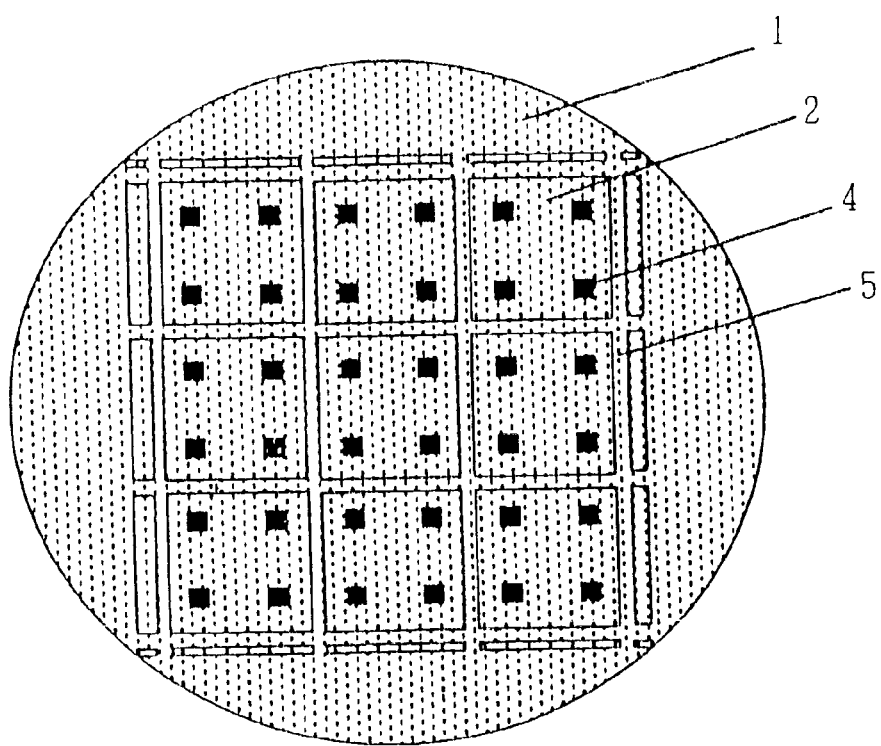
FIGS. 1(a) and 1(b) are a configurational view of a wafer showing a first embodiment of the present invention, in which a wafer process for forming semiconductor chips has been completed.
Figure 1:
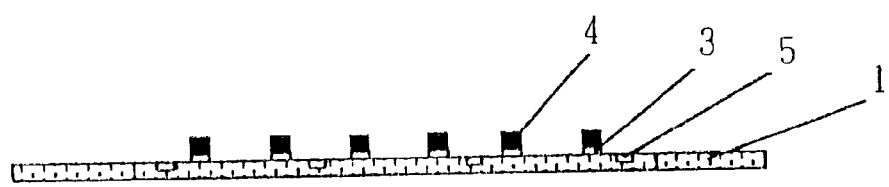

FIGS. 1(a) and 1(b) are views of the configuration of a wafer, according to a first embodiment of the present invention, in which a wafer process for forming semiconductor elements or chips has been completed, wherein FIG. 1(a) is a top view of the wafer, and FIG. 1(b) is a cross-sectional view of the wafer, respectively.

A plurality of regions 2, which constitute semiconductor elements or chips are disposed over a wafer 1. Bumps or protruding electrodes 4 are provided over their corresponding electrodes 3 within each semiconductor chip region 2. The semiconductor chip regions 2 are delimited by scribe lines 5.

Figure 2:
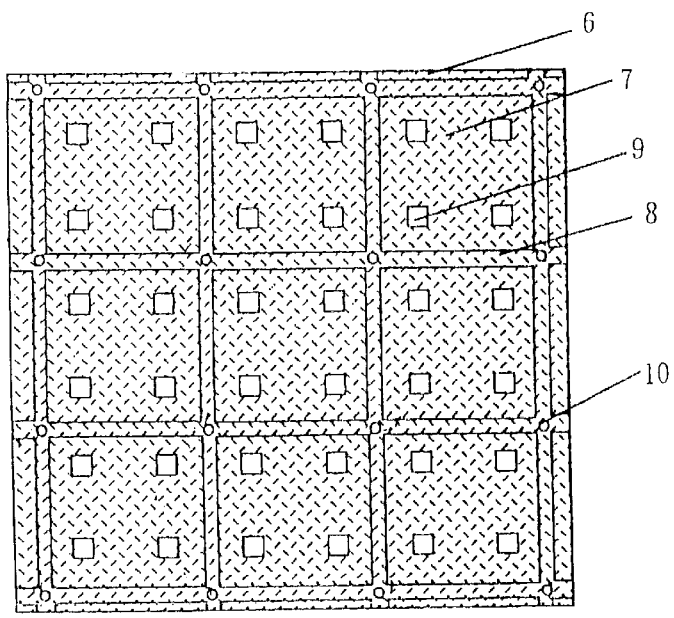
FIGS. 2(a)–2(c) are a configurational view showing a substrate employed in the first embodiment of the present invention.
Figure 2:
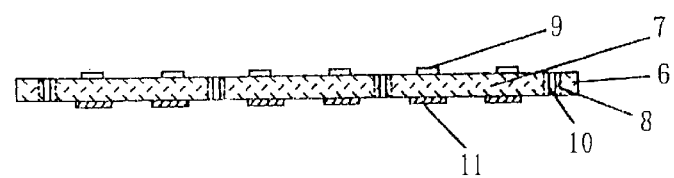
Figure 2:
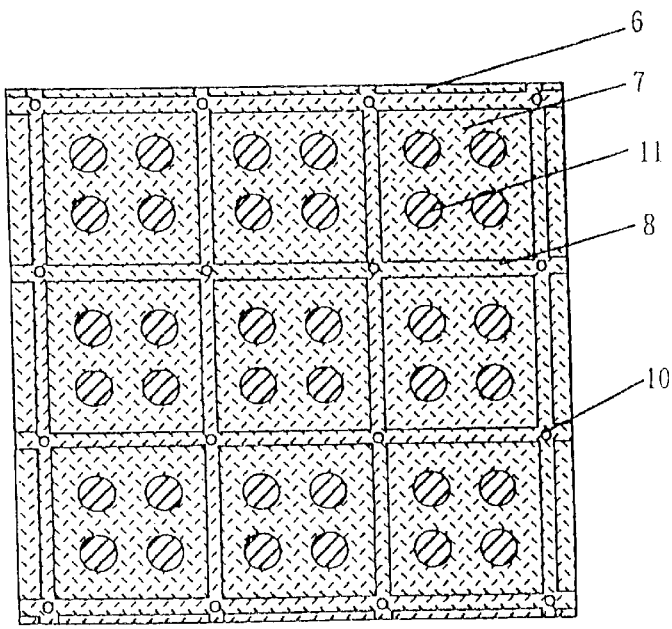

FIGS. 2(a) to 2(c) are views showing a configuration of a substrate employed in the present invention, wherein FIG. 2(a) is a plan view of the substrate as seen from above on the semiconductor chips loading side, FIG. 2(b) is a cross-sectional view thereof, and FIG. 2(c) is a plan view of the substrate as seen from above on the soldering side thereof, respectively.

As shown in FIG. 2(a), a substrate 6 on the semiconductor chips loading side includes a plurality of substrate body regions 7 separated or delimited by cut lines 8. A plurality of inner pads 9 are provided within the substrate body regions 7. As shown in FIG. 2(b), resin injecting holes 10 are respectively provided at portions where the cut lines 8 intersect, and extend through the substrate 6. As shown in FIG. 2(c), the substrate body regions 7 of the substrate 6 on the soldering side are also delimited by the cut lines 8. Further, the substrate body regions 7 are provided respective with connecting pads 11.

One feature of the present invention is that the substrate 6, and the wafer 1 comprised of the semiconductor chips 2 shown in FIGS. 1(a) and 1(b), are in a one-to-one correspondence with each other.

In this case, the same nine semiconductor chip 2s are provided over the wafer 1, as shown in FIG. 1(a). The semiconductor chips 2 are respectively delimited by scribed lines 5 each having a width of from about 50 $\mu$m to about 200$\mu$. Further, the protruding electrodes 4 are formed over the corresponding electrodes 3 provided within each semiconductor chip 2. A method of forming the protruding electrodes 4 has been executed by the aforementioned method or the like and the details thereof will therefore be omitted.

The present invention features that the substrate 6 is designed and fabricated according to design values of the wafer 1 and each semiconductor chip 2 formed over the wafer 1. Thus, the substrate 6 comprises the substrate body portions 7 (corresponding to portions which serve as semiconductor packages) for mounting or loading the semiconductor chips 2 thereon and portions cut away after the completion of resin filling, and is formed as a single substrate.

Described specifically, nine substrate body portions 7 corresponding to semiconductor chips 2 exist as shown in FIGS. 1(a),(1b) and 2(a)–2(c). They are divided by cut lines 8 having the same dimensional widths as scribe lines 5. In the respective substrate body portions 7, inner pads 9 are respectively provided at portions where bumps or protruding electrodes 4 of their corresponding semiconductor chips 2 are joined or bonded thereto.

Further, resin injecting holes 10 are provided over the cut lines 8. In the present embodiment, resin injecting holes 10 slightly smaller than the widths of the cut lines 8 are provided at the four corners of each substrate body portion 7 (while the sizes of the resin injecting holes may be arbitrary, if they do not exceed the cut line widths because they are finally cut, a diameter at which a dispenser can be inserted upon filling of a resin, may preferably be about 150 $\mu$m, for example). Even if the sizes of the resin injecting holes respectively exceed the cut line widths by about 0.1 mm, they may be adopted if no problem occurs in the design of patterns on the substrate.

A process performed for bonding or joining the inner pads 9 of the substrate 6 prepared in this way to their corresponding protruding electrodes 4 of each semiconductor chip 2. The substrate 6 and the wafer 1 are made coincident with each other in direction and position so that they are fit with each other, whereby the protruding electrodes 4 and their corresponding inner pads 9 are bonded to one another. Even as to such a bonding method, they may be bonded to one another by means of the widely-known, commonly used methods (such as a metal bonding system using a high-temperature process or a resin-based adhering method, etc.) as described above.

FIGS. 3(a)–3(e) are crss-sectional views illustrating process for mounting the above-described wafer on the substrate.

(1) Bumps or protruding electrodes 4 and inner pads 9 are first bonded to one another as shown in FIG. 3(a).

(2) A resin 12 is next injected via resin injecting holes 10 from dispensers 13 as shown in FIG. 3(b). Thereafter, the resin is gradually injected as shown in FIG. 3(c). Further, the resin 12 is charged between the wafer 1 and the substrate 6 and then cured as shown in FIG. 3(d).

Thus, the resin 12 is injected through the resin injecting holes 10 provided on the substrate 6 by a dispensing system and charged by a capillary phenomenon. After the completion of its charging, the resin 12 is cured.

(3) Afterwards, the cut lines 8 provided on the substrate 6 are cut from the substrate 6 side to the wafer 1 (semiconductor chips 2) by a method similar to a scribe process for dividing the semiconductor chips 2, as shown in FIG. 3(e). For the present mounting process, a method of cutting the cut lines 8 by cutting blades 14 is shown. Since the scribe lines 5 on the wafer 1 coincide with the cut lines 8 on the substrate 6 at this time, they can be easily aligned with one another from the soldering side, so that the cut lines 8 can be cut.

Figures 3, 4:
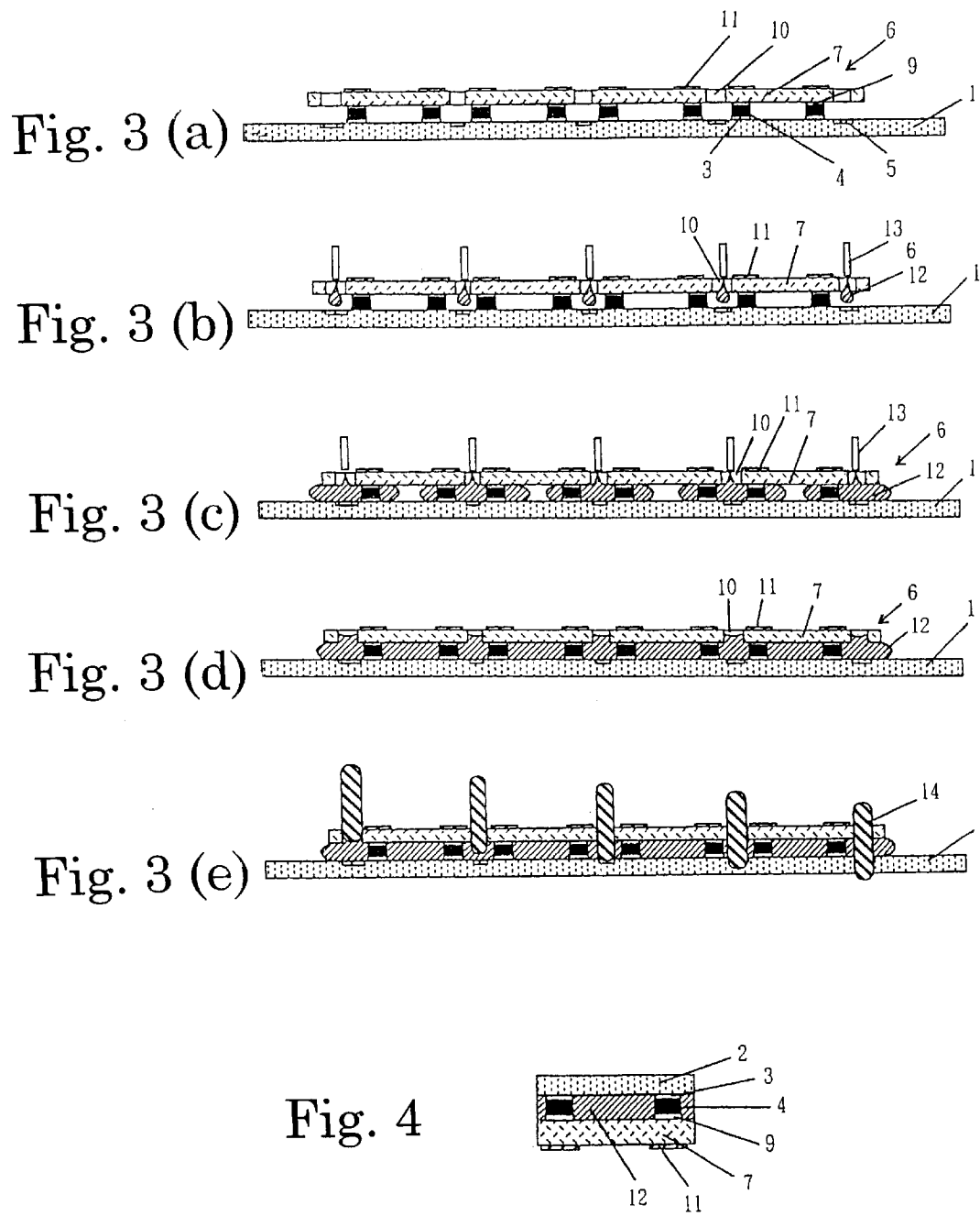
FIG. 4 is a cross-sectional view of a package according to the first embodiment of the present invention.

It is preferable to adopt a method (not illustrated in the drawings) of fixing the substrate and semiconductor chips onto the back of the wafer 1 with ultra-violet cured adhesive tapes or the like so that they do not fall to pieces when they are divided into each individual packages, and separating them into individuals after their cutting, in a manner similar to the normal wafer scribe process. Each package being separated in this way is as shown in FIG. 4 can be obtained.

Since the present embodiment is constructed in this way, an electric signal produced from each semiconductor chip 2 is joined or supplied from its corresponding electrode 3 to the inner pad 9 on the substrate 11 with the protruding electrode 4 interposed therebetween. Further, the electric signal reaches an external terminal through an interconnection provided within the substrate 11 and is transferred to the outside.

According to the first embodiment constructed in this way, the following advantageous effects can be obtained:

(1) Since a substrate having a plurality of substrate body portions and a wafer on which the same number of semiconductor chips are formed for each wafer, can be assembled at one time, mass production thereof is easy and hence the cost can be brought down.

(2) Since the substrate and the semiconductor chips can be cut simultaneously, the number of processes is reduced and hence the cost can be brought down. Simultaneously, end surfaces of each semiconductor chip and the substrate are completely aligned with one another, thus making it possible to meet a demand for a size reduction.

According to the manufacturing method of the present invention as described above, mass-producible high-quality devices can be provided in smaller sizes to have the same sizes as the semiconductor chips.

A second embodiment of the present invention will next be described.

Figure 5:
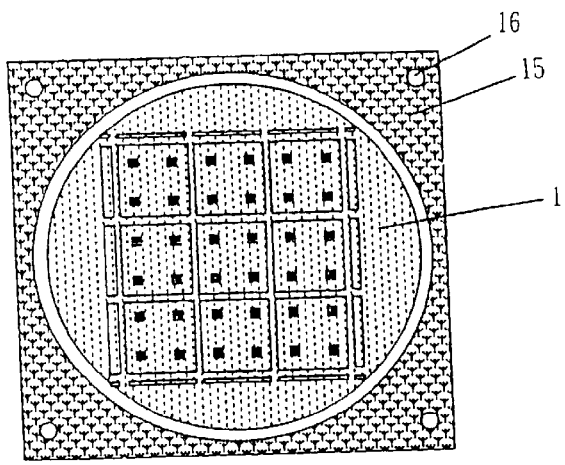
FIGS. 5(a) and 5(b) views illustrating a first process of a resin encapsulated semiconductor device according to a second embodiment of the present invention.
Figure 5:
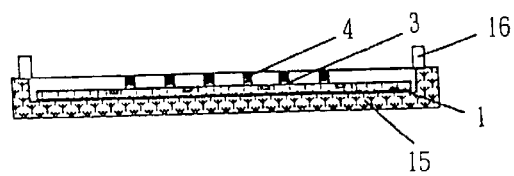
Figure 6:
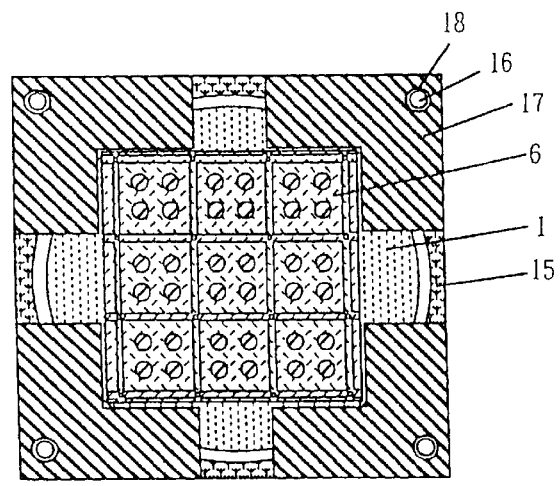
FIGS. 6(a) and 6(b) are views depicting a second process of the resin encapsulated semiconductor device according to the second embodiment of the present invention.
Figure 6:
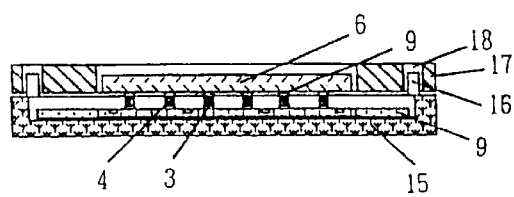

FIGS. 5(a)–5(b) illustrate a first process of a method for manufacturing a resin encapsulated semiconductor device according to the second embodiment of the present invention, wherein FIG. 5(a) is a state chart as seen from above, and FIG. 5(b) is a cross-sectional view thereof, respectively. FIGS. 6(a)–6(b) illustrate a second process of the metod for producing the resin encapsulated semiconductor device according to the second embodiment of the present invention, wherein FIG. 6(a) is a state chart as seen from above, and FIG. 6(b) is a cross-sectional view thereof, respectively.

While a manufacturing method according to the second embodiment is identical in summary to the first embodiment, in the second embodiments a substrate and a wafer are mechanically aligned with each other and then set. Incidentally, the same elements of structure as those employed in the first embodiment are identified by the same reference numerals and their description will therefore be omitted.

In a manner similar to the first embodiment, a process for bonding or joining inner leads of a prepared substrate to bumps or protruding electrodes of each semiconductor chip on a wafer respectively, is first executed. A wafer 1 is set on a wafer positioning jig 15 as shown in FIG. 5(b).

Next, when a substrate positioning jig 17 is placed on the wafer positioning jig 15 while the latter is kept in the state shown in FIG. 5(b) and thereafter a substrate 6 is set to the substrate positioning jig 17, as shown in FIGS. 6(a)–6(b), protruding electrodes 4 can be fit on their corresponding inner pads 9 as shown in FIG. 6(b). The wafer positioning jig 15 and the wafer 1, the substrate positioning jig 17 and the substrate 6, and the wafer positioning jig 15 and the substrate positioning jig 17 are respectively fixed at their determined positions.

Described specifically, mechanically fixing methods include, for example, determining positions according to shapes, or determining positions by defining holes in one jig and erecting or setting up pins on the other to thereby determine how the jigs fit together, etc. In the present embodiment, the wafer positioning jig 15 and the substrate positioning jig 17 are positioned by inserting pins 16 provided on the wafer positioning jig 15 into corresponding positioning holes 18 provided in the substrate positioning jig 17.

Thus, the protruding electrodes and their corresponding inner pads are positioned in direct opposition so that they may then be bonded to one another. A process similar to the first embodiment is effected subsequently to obtain a package structure.

According to the second embodiment as described above, since the alignment of the substrate with the wafer is easy and an improvement in accuracy is achieved in addition to the effect of the first embodiment described above, assembly yields are enhanced and an improvement in quality is achieved.

Further, a high-quality resin encapsulated semiconductor device, and a mounting structure therefor, of the same size as the semiconductor chip (in small size), can be obtained.

A third embodiment of the present invention will next be described.

Figure 7:
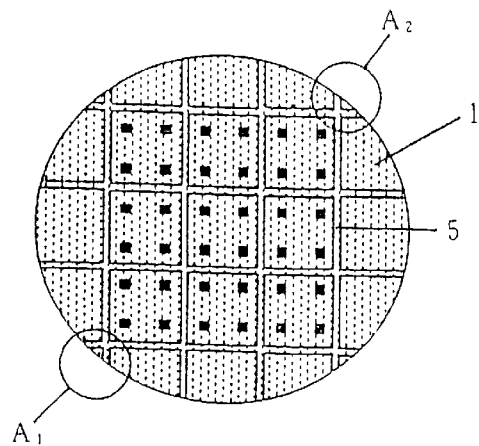
FIGS. 7(a) and 7(b) are views showing a wafer illustrative of a third embodiment of the present invention.
Figure 7:
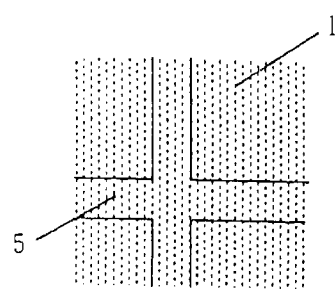
Figure 8:
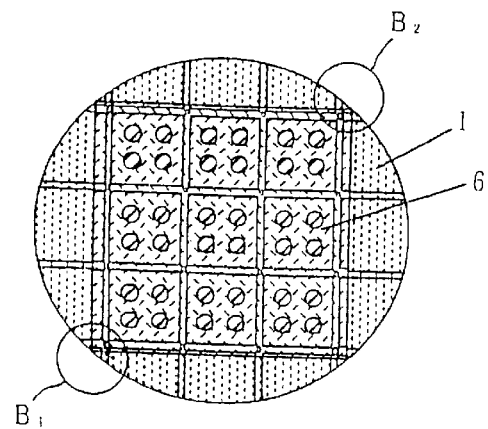
FIGS. 8(a) and 8(b) are views for describing the alignment of the wafer showing the third embodiment of the present invention with a substrate.
Figure 8:
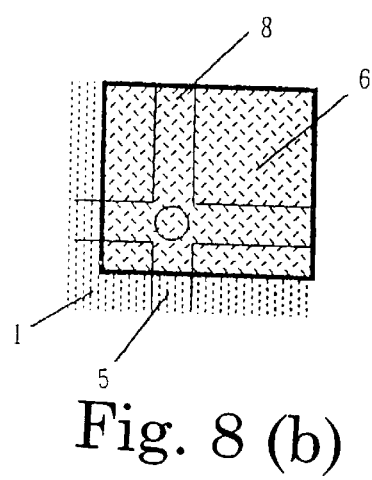

FIGS. 7(a) and 7(b) are views illustrating a wafer according to the third embodiment of the present invention, wherein FIG. 7(a) is an overall plan view of the wafer, and FIG. 7(b) is an enlarged plan view of a portion $A_1$ shown in FIG. 7(a), respectively. FIGS. 8(a) and (b) are views illustrating the alignment of the wafer of the third embodiment of the present invention with a substrate, wherein FIG. 8(a) is a state chart showing the mounting of the substrate on the wafer, and FIG. 8(b) is an enlarged plan view of a portion $B_1$ in FIG. 8(a), respectively.

While a manufacturing method according to the present embodiment is identical in summary to the first embodiment, in the present embodiment the substrate and the wafer are aligned with each other by image processing, and thereafter set. Incidentally, the same elements of structure as those employed in the first embodiment are identified by the same reference numerals and the description thereof will therefore be omitted.

A process for bonding inner leads of a prepared substrate to their corresponding protruding electrodes of each semiconductor chip is first executed in a manner similar to the first embodiment. As shown in FIG. 7(a), images of two points $A_1$ and $A_2$, which are diagonally opposite each other at the outermost corners, at which scribe lines 5 intersect on the wafer 1 are identified through the use of a camera or the like.

Thereafter, as shown in FIG. 8(a), images of points $B_1$ and $B_2$ corresponding to the above-described points $A_1$ and $A_2$, and which are diagonally opposite each other at the outermost corners at which cut lines 8 intersect on intersect, are similarly identified, and a substrate 6 is set to such a position that recognized data about the previous wafer coincides with the form thereof. As a result, protruding electrodes 4 can be aligned with their corresponding inner pads 9.

Since the present method is similar to a method widely used for alignment in an assembly process (e.g., scribe process, die-bond process or the like) for a semiconductor device, it can be easily introduced. While it is necessary to transfer the wafer 1 and the substrate 6 in practice, illustration and description of a transfer mechanism therefore will be omitted. Thus, the aligned protruding electrodes 4 are bonded to their corresponding inner pads 9. A process similar to the first embodiment is effected subsequently to obtain a package structure.

According to the third embodiment as described above, since the alignment of the substrate with the wafer is easy, and an improvement in accuracy is achieved in a manner similar to the second embodiment therefore in addition to the effect described in the first embodiment, assembly yields are enhanced and an improvement in quality is achieved.

Namely, according to the manufacturing method employed in the present embodiment, a high-quality device in the same size as the semiconductor chip (in small size), can be provided A fourth embodiment of the present invention will next be described.

Figure 9:
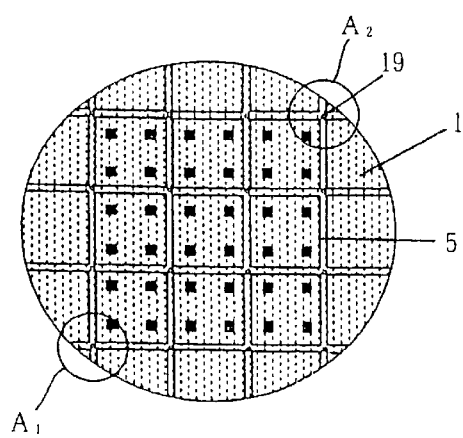
FIGS. 9(a) and 9(b) are views for describing a wafer showing a fourth embodiment of the present invention.
Figure 9:
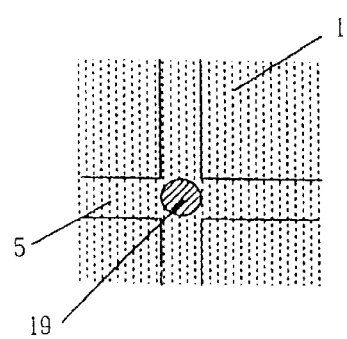

FIGS. 9(a) and 9(b) are views illustrating a wafer according to a fourth embodiment for describing a wafer showing a fourth embodiment of the present invention, wherein FIG. 9(a) is an overall plan view of the wafer, and FIG. 9(b) is an enlarged plan view of a portion $A_1$ in FIG. 9(a), respectively. FIGS. 10(a) and 10(b) are a views illustrating the alignment of the wafer of the fourth embodiment of the present invention with a substrate, wherein FIG. 10(a) is a state chart showing the mounting of the substrate on the wafer, and FIG. 10(b) is an enlarged plan view of a portion $B_1$ in FIG. 10(a), respectively. Incidentally, the same elements of structure as those employed in the third embodiment are identified by the same reference numerals and the description thereof will therefore be omitted.

While a manufacturing method according to the present embodiment is otherwise identical in summary to the first embodiment, in the present embodiment the substrate and the wafer are aligned with each other by image processing, and thereafter set.

A process for bonding inner leads of a prepared substrate to their corresponding protruding electrodes of each semiconductor chip is first executed in a manner similar to the first embodiment. Identifying marks 19 for alignment are provided at intersecting points on scribe lines 5 of a wafer 1 in a wafer processing stage. The identifying marks 19 are made up of aluminum or the like. It is important that they are formed in patterns clearly different from the scribed lines 5, so that they are easily recognized. While the identifying marks 19 are provided as circular marks in the present embodiment, they are designed to correspond to the shape and size of each resin injecting hole defined in the substrate.

Described specifically, the identifying mark 19 is set identical in shape and size to the resin injecting hole 10 or set smaller than the resin injecting hole by about 0.1 mm. Of the marks provided in this way, images of the marks at two points $A_1$ and $A_2$, which points are diagonally opposite each other at the outermost corners at which the scribe lines 5 intersect, are identified by means of a camera or the like.

Thereafter, as shown in FIG. 10(a), images of the points $B_1$ and $B_2$ corresponding to the above-described marks on the wafer 1, and which are diagonally opposite each other at the outermost corners of the substrate 6 at which cut lines 8 intersect, are similarly identified, and the substrate 6 is set so that they coincide with recognized data about the previous wafer 1. As a result, protruding electrodes 4 can be aligned with their corresponding inner pads 9.

FIG. 10(b) is an enlarged view of the point $B_1$ at which the alignment has been completed, and shows a state in which each resin injecting hole 10 defined in the substrate 6, and its corresponding identifying mark 19, are being aligned. Since the present method is similar to the method widely used for alignment in the assembly process (e.g., scribe process, die-bond process or the like) for the semiconductor device, it can be easily introduced. While it is necessary to actually transfer the wafer and the substrate, a illustration and description of transfer mechanism therefore will be omitted.

Thus, the aligned protruding electrodes are joined to their corresponding inner pads. A process similar to the first embodiment is effected subsequently to obtain a package structure.

According to the fourth embodiment constructed as described above, since the alignment of the substrate with the wafer is easy and an improvement in accuracy is achieved in a manner similar to the second embodiment, therefore in addition to the effect described in the first embodiment, assembly yields are enhanced and an improvement in quality is achieved.

A high-quality device can be provided in the same size as the semiconductor chip (in small size).

A fifth embodiment of the present invention will next be described.

While a manufacturing method employed in the fifth embodiment is otherwise identical in summary to the first embodiment, the fifth embodiment differs from previous embodiments with respect to a method of charging a resin into a clearance defined between a substrate and a wafer.

The resin is individually injected through resin injecting holes provided over the substrate by a dispensing system. This case adopts a method of gradually charging the resin from the resin injecting holes provided in the central portion of the substrate to the resin injecting holes provided at its peripheral portion.

FIG. 11 illustrates one example of the order of the dispensing the resin from the resin injecting holes. After the completion of the resin filling, the resin is cured and the resulting structure divided into individual packages, so that the packages, such as the one shown in FIG. 4 are completed.

According to the fifth embodiment, a method of firstly charging a resin into central resin injecting holes provided on a substrate (in the order 1 through 4) and gradually charging the resin into resin injecting holes provided at a peripheral portion of the substrate (in the order 5 through 16) has been adopted in addition to the effect described in the first embodiment. Thus, the present embodiment can obtain an advantageous effect in that bubbles developed upon filling of the resin can escape to the outside, whereby the filling is easily improved and voids (bubbles) can be restrained from occurring.

Accordingly, the yield of resin filling and an improvement in quality can be expected.

Further, a high-quality device can be provided in the same size as a semiconductor device (in a small size).

A sixth embodiment of the present invention will next be explained.

While a manufacturing method employed in the sixth embodiment is otherwise identical in summary to the first embodiment, the sixth embodiment differs from the other embodiments in the method of charging a resin into a clearance defined between a substrate and a wafer.

The resin is successively individually injected into resin injecting holes other than the resin injecting holes provided over the substrate by a dispensing system. This case adopts a method of charging the resin from one corner corresponding to the outermost portion to the center and to the diagonal corners in a fan shape.

FIG. 12 illustrates one example of the sequence of the dispensing resin from resin injecting holes. After the completion of the resin filling, the resin is cured and the resulting structure is divided into individual packages, whereby the packages such as is shown in FIG. 4 are completed.

According to the sixth embodiment performed in this way, the method includes, in addition to the effect steps described for the first embodiment, firstly charging a resin into resin injecting holes (1, 2 and 3) at the outermost corner, which are provided on a substrate, and gradually charging the resin into resin injecting holes (4, 5 and 6) lying on a sectorial shape. Thus, the present embodiment can bring about an advantageous effect in that bubbles developed upon filling of the resin can escape in fan form, whereby the filling property is improved, and voids (bubbles) can be restrained from occurring. Accordingly, the yield of resin filling, and an improvement in quality can be expected.

Further, a high-quality device can be provided in the same size as a semiconductor device (in small size).

Incidentally, the present invention is not necessarily limited to the above-described embodiments. Various modifications can be made thereto based on the spirit of the present invention, and they will not be excluded from the scope of the present invention.

According to the present invention as described above in detail, the following advantageous effects can be brought about:

(A) Since a substrate having a plurality of substrate body portions and a wafer formed with the same number of semiconductor chips for each wafer can be assembled at one time, mass production thereof is easy and hence the cost can be brought down.

(B) Since the substrate and the semiconductor chips can be cut simultaneously, the number of processes is reduced and hence the cost can be brought down. Simultaneously, end surfaces of each semiconductor chip and the substrate are fully aligned with one another, thus making it possible to meet a demand for a size reduction.

(C) Since the alignment of the substrate with the wafer is easy and the accuracy is improved, the yield of assembly is enhanced and the product quality is improved.

(D) Since bubbles produced upon filling of a resin can be avoided, the filling is easy improved and voids (bubbles) can be restrained from occurring. With their effects, the yield of resin filling and an improvement in quality can be expected.

What is claimed is:

1. A method of manufacturing a semiconductor device comprising the steps of:

providing a semiconductor wafer having a main surface, the semiconductor wafer including a plurality of semiconductor chip regions each of which has a protruding electrode formed on the main surface of the semiconductor wafer, a plurality of scribe lines on the main surface surrounding each of the semiconductor chip regions;

providing a substrate having a chip mounting surface and a back surface, the substrate including a plurality of main body portions each of which corresponds to one of the semiconductor chip regions and a plurality of cut lines each of which corresponds to one of the scribe lines, each of the main body portions having an inner pad formed on the chip mounting surface and a connecting pad formed on the back surface, the inner pad corresponding to the protruding electrode, each of the cut lines having a resin injecting hole extending from the chip mounting surface to the back surface;

mounting the substrate with the chip mounting surface on the main surface of the semiconductor wafer so that the protruding electrodes are connected to the inner pads, respectively, and a space between the chip mounting surface of the substrate and the main surface of the semiconductor wafer is created;

injecting a resin into the space between the chip mounting surface and the main surface through resin injecting holes;

curing the injected resin; and cutting the substrate, the cured resin and the semiconductor wafer along the cut lines so as to provide a plurality of semiconductor devices each of which includes one of the semiconductor chip regions of the semiconductor wafer, the main body portion of the substrate are corresponding thereto, and the cured resin therebetween.

2. A method of manufacturing a semiconductor device according to claim 1, wherein each cut line has a first width and wherein each resin injecting hole has a second width which is substantially equal to or smaller than the first width.

3. A method of manufacturing a semiconductor device according to claim 1, wherein each resin injecting hole is located at intersections of the cut lines.

4. A method of manufacturing a semiconductor device according to claim 1, wherein the substrate has a positioning mark and wherein said step of mounting includes fixing the semiconductor wafer and the substrate on a positioning jig using the positioning mark.

5. A method of manufacturing a semiconductor device according to claim 4, wherein the positioning jig has a protruding pin and the positioning mark is a hole for inserting the protruding pin.

6. A method of manufacturing a semiconductor device according to claim 1, wherein said step of mounting includes recognizing two intersect portions of the cut lines by an image reader, recognizing two intersect portions of the scribe lines by the image reader, and coinciding the recognized intersect portions so that the substrate and the semiconductor wafer are aligned each other.

7. A method of manufacturing a semiconductor device according to claim 1, wherein each scribe line includes a positioning pattern corresponding to the resin injecting hole of the cut line corresponding thereto, and wherein said step of mounting includes recognizing the positioning pattern by an image reader, recognizing the resin injecting hole by the image reader, and coinciding the recognized data so that the substrate and the semiconductor wafer are aligned with each other.

8. A method of manufacturing a semiconductor device according to claim 1, wherein the step of injecting includes injecting a resin through a resin injecting hole located in a central portion of the substrate; and then injecting a resin through a resin injecting hole located in a peripheral portion of the substrate.

9. A method of manufacturing a semiconductor device according to claim 1, wherein the step of injecting includes injecting a resin through a corner resin injecting hole located in one of the corner portions of the substrate; and then injecting a resin through resin injecting holes located in a sectorial position of the corner resin injecting hole.

10. A method of manufacturing a semiconductor device comprising the steps of:

providing a semiconductor wafer having a main surface, the semiconductor wafer including a plurality of rectangular semiconductor chip regions each of which has a protruding electrode formed on the main surface of the semiconductor wafer and a plurality of scribe lines located on the main surface around the semiconductor chip regions, so that the scribe lines intersect at corners of the semiconductor chip regions;

providing a substrate having a chip mounting surface and a back surface, the substrate including a plurality of rectangular main body portions each of which corresponds to one of the semiconductor chip regions and a plurality of cut lines each of which corresponds to one of the scribe lines, each of the main body portions having an inner pad formed on the chip mounting surface and a connecting pad formed on the back surface, the inner pad located at a corresponding position of the protruding electrode, each of the cut lines having a resin injecting hole passing through the substrate;

fixing the chip mounting surface of the substrate on the main surface of the semiconductor wafer at the position where the protruding electrodes are connected to the inner pads, respectively, so that a space between the chip mounting surface of the substrate and the main surface of the semiconductor wafer is created;

injecting a resin into the space between the chip mounting surface and the main surface via the resin injecting holes;

curing the injected resin so that a structure including the substrate, the cured resin and the semiconductor wafer is formed; and cutting the structure along the cut lines to provide a plurality of semiconductor devices each of which includes one of the semiconductor chip regions of the semiconductor wafer, the substrate main body portion corresponding thereto and the cured resin therebetween.

11. A method of manufacturing a semiconductor device according to claim 10, wherein each cut line has a first width and wherein each resin injecting hole has a second width which is substantially equal to or smaller than the first width.

12. A method of manufacturing a semiconductor device according to claim 10, wherein each resin injecting hole is located at an intersection of the cut lines.

13. A method of manufacturing a semiconductor device according to claim 10, wherein the substrate has a positioning mark and wherein said step of mounting includes fixing the semiconductor wafer and the substrate on a positioning jig using the positioning mark.

14. A method of manufacturing a semiconductor device according to claim 13, wherein the positioning jig has a protruding pin and the positioning mark is a hole for inserting the protruding pin.

15. A method of manufacturing a semiconductor device according to claim 10, wherein said step of fixing includes recognizing two intersect portions of the cut lines by an image reader, recognizing two intersect portions of the scribe lines by the image reader, and coinciding the recognized intersect portions so that the substrate and the semiconductor wafer are aligned each other.

16. A method of manufacturing a semiconductor device according to claim 10, wherein each scribe line includes a positioning pattern corresponding to the resin injecting hole, and wherein said step of fixing includes recognizing the positioning pattern by an image reader, recognizing the resin injecting hole by the image reader, and coinciding the recognized data so that the substrate and the semiconductor wafer are aligned each other.

17. A method of manufacturing a semiconductor device according to claim 10, wherein step of injecting includes injecting a resin to via a resin injecting hole located in a central portion of the substrate; and then injecting a resin via a resin injecting hole located in a peripheral portion of the substrate.

18. A method of manufacturing a semiconductor device according to claim 10, wherein step of injecting includes injecting a resin through a resin injecting hole located in one of the corner portion of the substrate; and then injecting a resin through resin injecting holes located in a sectorial position of the previous resin injecting hole.

19. A method of manufacturing a plurality of semiconductor devices comprising the steps of:

providing a semiconductor wafer having a main surface, the semiconductor wafer including a plurality of rectangular semiconductor chip regions delimited by a plurality of scribe lines, each of the semiconductor chip regions having a protruding electrode formed on the main surface of the semiconductor wafer;

providing a substrate having a chip mounting surface and a back surface, the substrate including a plurality of rectangular main body portions delimited by a plurality of cut lines, each of the main body portions having an inner pad formed on the chip mounting surface and a connecting pad formed on the back surface, wherein each of the rectangular main body portions, the cut lines and the inner pad corresponds to the rectangular semiconductor chip regions, the scribe lines and the protruding electrode, respectively, in a one-to-one correspondence;

fixing the chip mounting surface of the substrate on the main surface of the semiconductor wafer at the position where the protruding electrodes are connected to the inner pads, respectively, so that a space between the chip mounting surface of the substrate and the main surface of the semiconductor wafer is created;

injecting a resin to the space between the chip mounting surface and the main surface via resin injecting holes;

curing the injected resin so that a structure including the substrate, the cured resin and the semiconductor wafer is formed; and cutting the structure along the cut lines so that a plurality of semiconductor devices each of which includes the semiconductor chip region of the semiconductor wafer, the cured resin and the main body portion of the substrate are provided.

20. A method of manufacturing semiconductor devices according to claim 19, wherein the cut line has a first width and wherein the resin injecting hole has a second width which is substantially equal to or smaller than the first width.

21. A method of manufacturing semiconductor devices according to claim 19, wherein the resin injecting hole is located on the cut line at a corner of the semiconductor chip region.

22. A method of manufacturing a semiconductor device according to claim 19, wherein step of injecting includes injecting a resin through a resin injecting hole located in a central portion of the substrate; and then injecting a resin through a resin injecting hole located in a peripheral portion of the substrate.

* * * * *